United States Patent
Peng et al.

(10) Patent No.: US 9,999,153 B1
(45) Date of Patent: Jun. 12, 2018

(54) SERVER

(71) Applicants: INVENTEC (PUDONG) TECHNOLOGY CORPORATION, Shanghai (CN); INVENTEC CORPORATION, Taipei (TW)

(72) Inventors: Ping-Wei Peng, Taipei (TW); Wen-Long Huang, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days. days.

(21) Appl. No.: 15/448,393

(22) Filed: Mar. 2, 2017

(30) Foreign Application Priority Data

Dec. 12, 2016 (CN) .......................... 2016 1 1140797

(51) Int. Cl.
| | |
|---|---|
| *H02B 1/20* | (2006.01) |
| *H02B 1/01* | (2006.01) |
| *G06F 1/16* | (2006.01) |
| *H05K 7/20* | (2006.01) |
| *H05K 7/14* | (2006.01) |
| *H01R 9/16* | (2006.01) |

(52) U.S. Cl.
CPC ............ *H05K 7/1487* (2013.01); *H01R 9/16* (2013.01); *H05K 7/1489* (2013.01); *H05K 7/20172* (2013.01); *H05K 7/20736* (2013.01); *H05K 7/20727* (2013.01)

(58) Field of Classification Search
CPC ............ H05K 7/1487; H05K 7/20727; H05K 7/20172

USPC .............. 361/679.46, 679.48, 724–727, 695, 361/825–826; 312/223.1, 223.2; 211/26
See application file for complete search history.

(56) References Cited

U.S. PATENT DOCUMENTS

| | | | | |
|---|---|---|---|---|
| 5,136,468 A * | 8/1992 | Wong | ....................... | G06F 1/184 361/679.6 |
| 6,762,932 B2 * | 7/2004 | Regimbal | ............... | G06F 1/184 361/679.33 |
| 6,851,925 B2 * | 2/2005 | Chuang | ................. | F04D 29/601 361/695 |
| 8,665,588 B2 * | 3/2014 | Sun | .......................... | G06F 1/187 211/26 |
| 8,897,008 B2 * | 11/2014 | Terwilliger | ............... | G06F 1/20 165/104.33 |
| 9,694,451 B1 * | 7/2017 | Ross | ....................... | B23P 15/26 |
| 2009/0196680 A1 * | 8/2009 | Hu | ....................... | H05K 7/1487 403/102 |

(Continued)

*Primary Examiner* — Nidhi Thaker
(74) *Attorney, Agent, or Firm* — Maschoff Brennan

(57) ABSTRACT

A server includes a motherboard, a base, a back plate, a hard disk and a fan module. The base is fixed on the motherboard. The back plate is placed upright on the base. The back plate and the base jointly form a fan accommodating space and a hard disk accommodating space. The back plate has a first side face and a second side face. The first side face faces the fan accommodating space. The second side face faces the hard disk accommodating space. The back plate is electrically connected to the motherboard. The hard disk is located in the hard disk accommodating space and electrically connected to the back plate. The fan module is located in the fan accommodating space and electrically connected to the back plate. The fan module is electrically connected to the motherboard via the back plate.

7 Claims, 4 Drawing Sheets

(56) References Cited

U.S. PATENT DOCUMENTS

| | | | |
|---|---|---|---|
| 2009/0196684 A1* | 8/2009 | Hu | G06F 1/183 |
| | | | 403/353 |
| 2011/0158791 A1* | 6/2011 | Li | G06F 1/20 |
| | | | 415/119 |
| 2011/0255238 A1* | 10/2011 | Tan | G06F 1/183 |
| | | | 361/679.48 |
| 2012/0243178 A1* | 9/2012 | Zhang | G06F 1/187 |
| | | | 361/695 |

* cited by examiner

US 9,999,153 B1

SERVER

CROSS-REFERENCE TO RELATED APPLICATIONS

This non-provisional application claims priority under 35 U.S.C. § 119(a) on Patent Application No(s). 201611140797.0 filed in China on Dec. 12, 2016, the entire contents of which are hereby incorporated by reference.

BACKGROUND OF THE DISCLOSURE

Technical Field of the Disclosure

The disclosure relates to an electronic device, more particularly to a server.

Description of the Related Art

With development of electronic technology, servers have become a data process system which is widely used in many fields. A server usually has a motherboard, power supply, various types of computer disk, fan etc.

In order to provide better service for users, server manufacturers are trying to improve the performance of their servers. Generally, the performance of the server is increased with the amount of the components in the server. For example, the storage capacity of the server will be increased if the amount of the hard disks is increased. In another example, the heat dissipation capability of the server will be increased if the amount of the fans is increased.

SUMMARY OF THE INVENTION

The present disclosure provides a server which is favorable for the expansion of the components therein.

One embodiment of the disclosure provides a server including a motherboard, a base, a back plate, a hard disk and a fan module. The base is fixed on the motherboard. The back plate is placed upright on the base. The back plate and the base jointly form a fan accommodating space and a hard disk accommodating space. The back plate has a first side face and a second side face. The first side face faces the fan accommodating space. The second side face faces the hard disk accommodating space. The back plate is electrically connected to the motherboard. The hard disk is located in the hard disk accommodating space and electrically connected to the back plate. The fan module is located in the fan accommodating space and electrically connected to the back plate. The fan module is electrically connected to the motherboard via the back plate.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
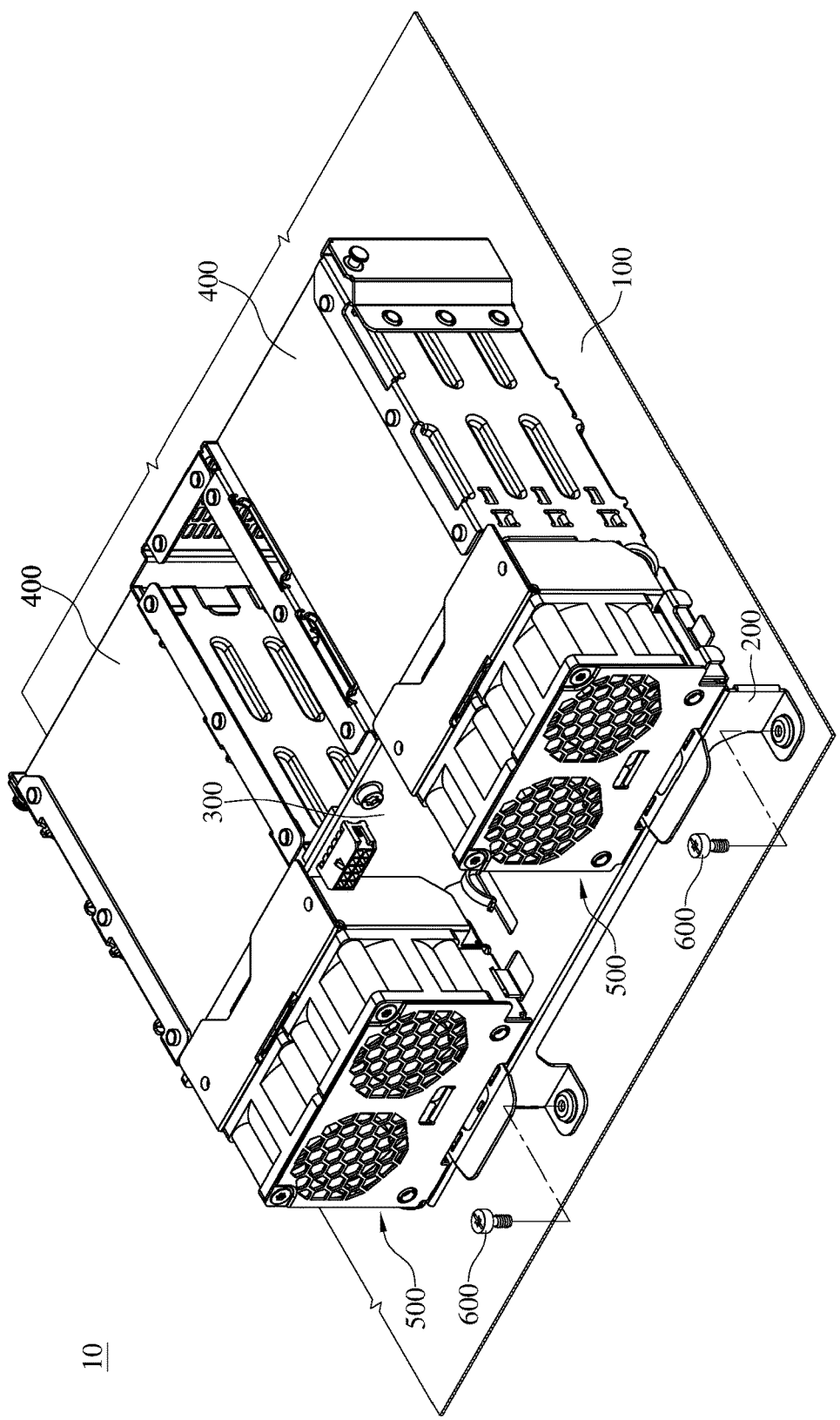
FIG. 1 is a partial perspective view of a server according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
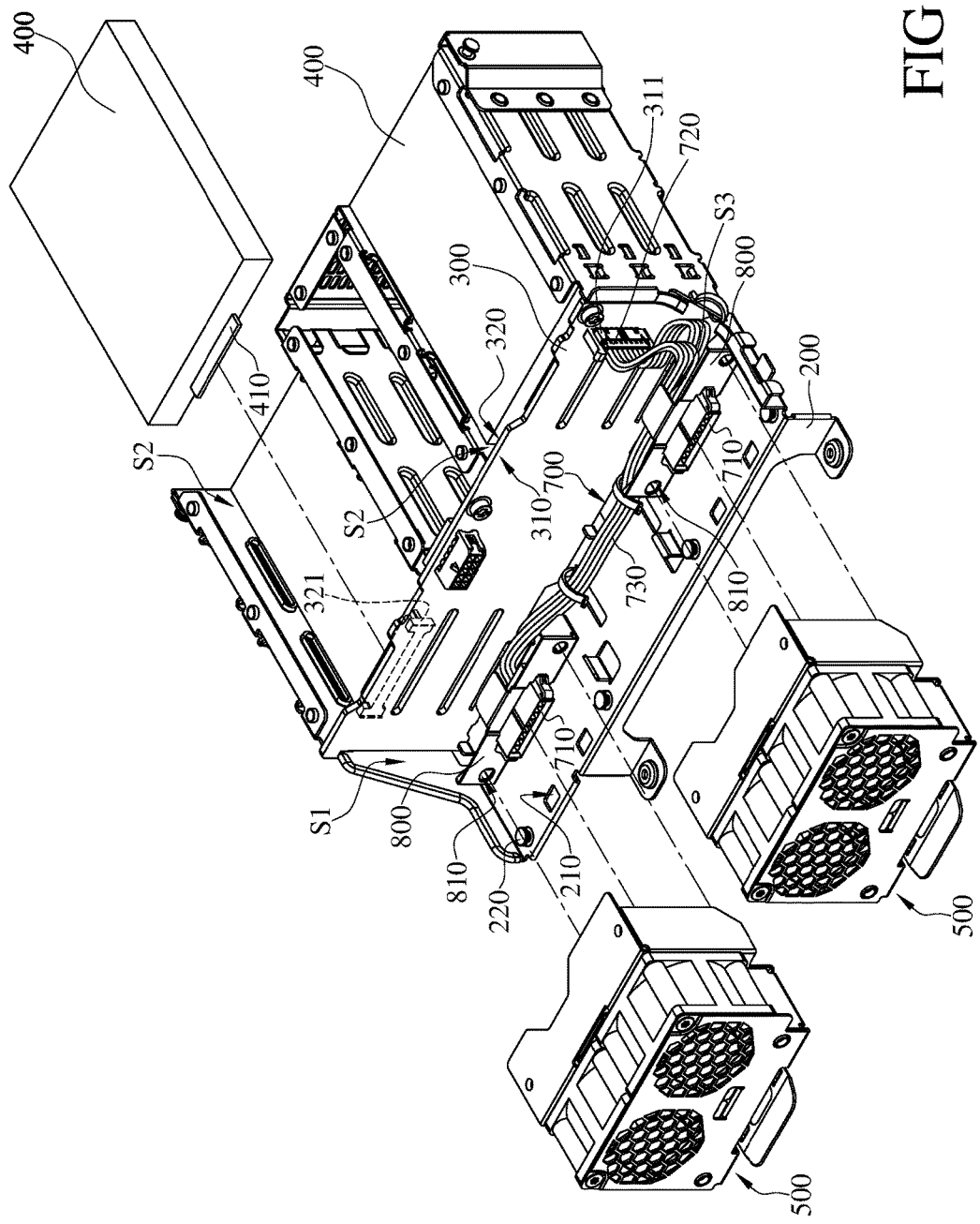
FIG. 2 is an exploded view of the server in FIG. 1.
Figure 3:
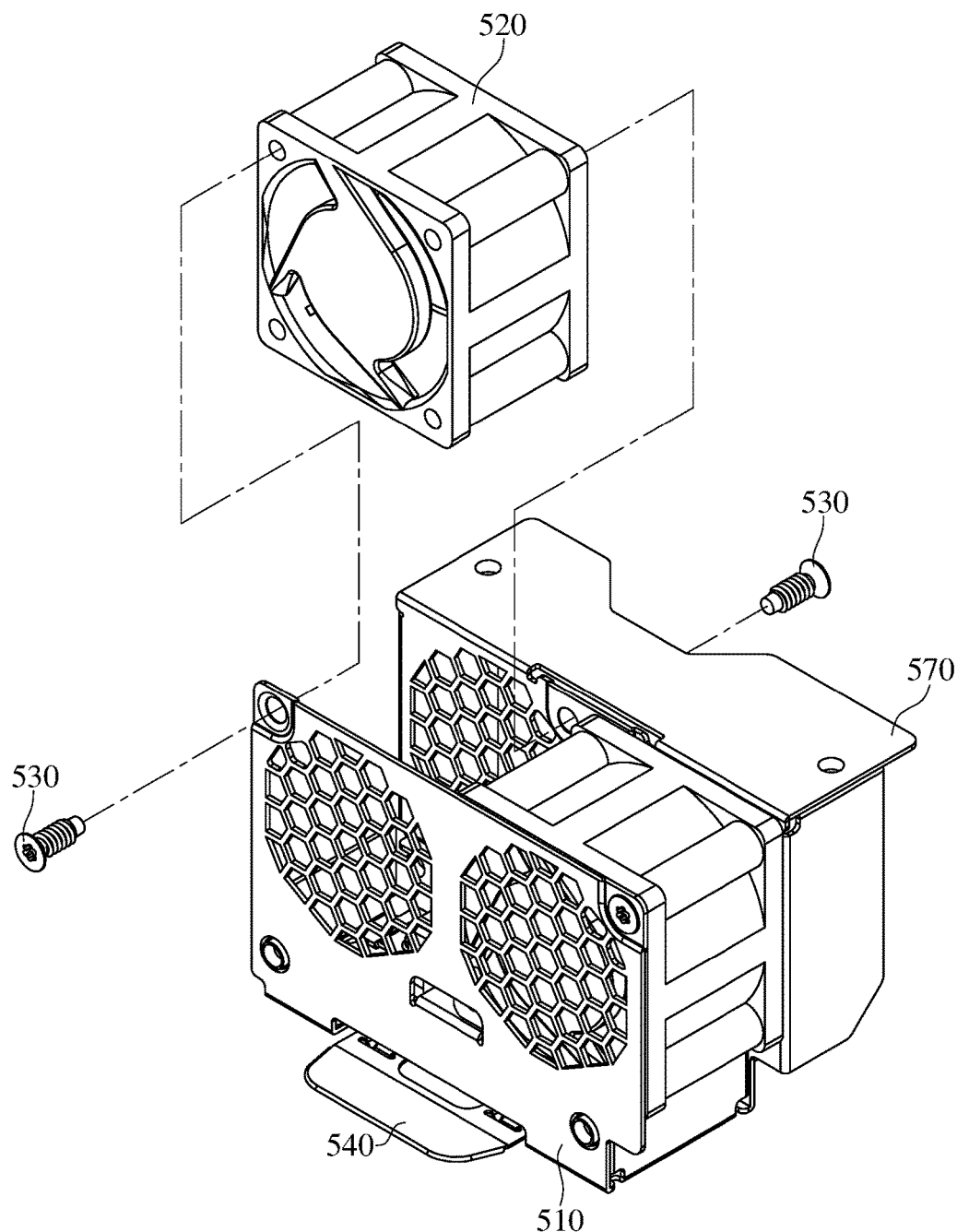
FIG. 3 is an exploded view of a fan module in FIG. 2.
Figure 4:
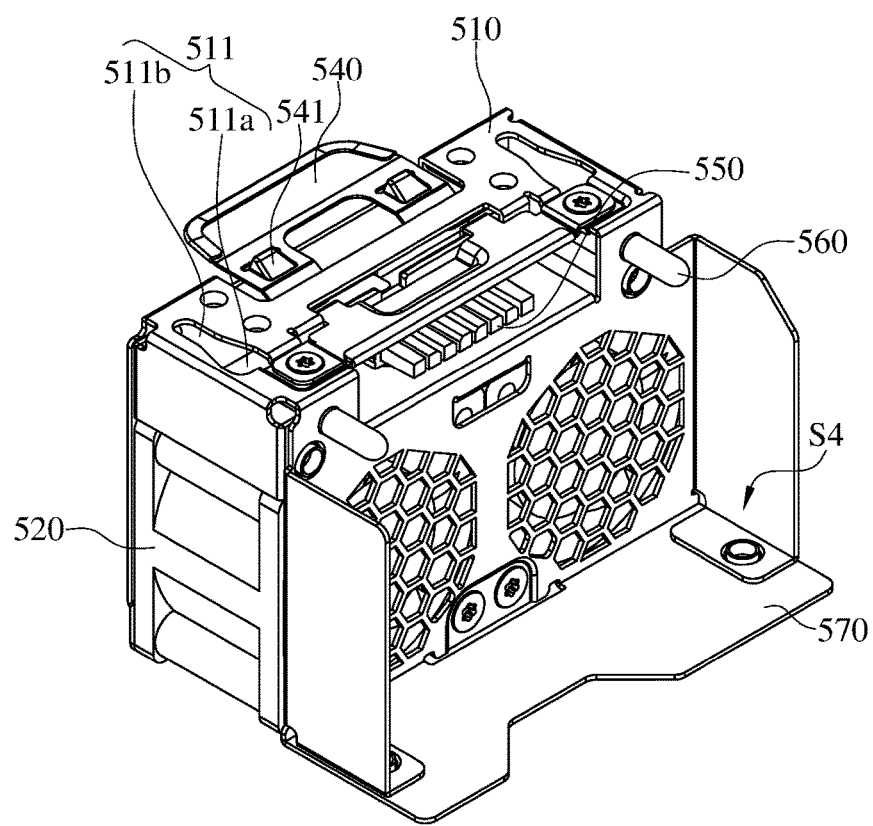
FIG. 4 is a partial perspective view of the fan module in FIG. 2.

Please refer to FIG. 1 to FIG. 4. FIG. 1 is a partial perspective view of a server according to one embodiment of the disclosure, FIG. 2 is an exploded view of the server in FIG. 1, FIG. 3 is an exploded view of a fan module in FIG. 2, and FIG. 4 is a partial perspective view of the fan module in FIG. 2.

In this embodiment, a serve 10 is provided. The server 10 includes a motherboard 100, a base 200, a back plate 300, a plurality of hard disks 400 and two fan modules 500.

The motherboard 100 is mounted with, for example, a central process unit (CPU), a graphics card, a memory and an expansion card (not shown). The base 200 is fixed to the motherboard 100 via a fastener 600. The base 200 has a plurality of fastening holes 210 and a plurality of blocks 220.

The back plate 300 is, for example, a circuit board. The back plate 300 is placed upright on the base 200, and is electrically connected to the motherboard 100. The base 200 and the back plate 300 jointly form a fan accommodating space S1 and a hard disk accommodating space S2 which are respectively located on two sides of the back plate 300 which are opposite to each other. The fastening holes 210 and the blocks 220 of the base 200 are located in the fan accommodating space S1.

In addition, the back plate 300 includes a first side face 310 and a second side face 320. The first side face 310 faces the fan accommodating space S1, and the second side face 320 faces the hard disk accommodating space S2. The first side face 310 has a first connector 311. The second side face 320 has a plurality of second connectors 321.

The hard disks 400 are located in the hard disk accommodating space S2. Each hard disk 400 has a fourth connector 410. The fourth connectors 410 of the hard disks 400 are respectively electrically connected to the second connectors 321 of the back plate 300.

The fan modules 500 are located in the fan accommodating space S1. Each fan module 500 includes a frame 510, two fans 520 and a plurality of fasteners 530. The frame 510 further includes two mounting holes 511. Each of the mounting holes 511 is, for example, a pear-shaped hole. Each of the mounting holes 511 has an enlarged portion 511a and a reduced portion 511b. The enlarged portion 511a has a first width. The reduced portion 511b has a second width. The block 220 has a third width. The first width of the enlarged portion 511a is greater than the third width of the block 220, and the second width of the reduced portion 511b is less than the third width of the block 220. The two fans 520 are mounted on the frame 510. Each fan module 500 has a third connector 550, and the two fans 520 are electrically connected to the third connector 550. However, the present disclosure is not limited to the amount of the mounting holes 511. In other embodiments, the frame may include only one mounting hole.

The mounting hole 511 of the frame 510 is slidably mounted on the block 220 of the base 200. The third connector 550 of the fan module 500 is electrically connectable to the back plate 300, so that the fan module 500 is able to be electrically connected to the motherboard 100 via the back plate 300. In addition, the fan module 500 further includes a fixed elastic plate 540. The fixed elastic plate 540 is fixed to the frame 510 and has a plurality of fastening structures 541. The fastening structures 541 are detachably hooked to the fastening holes 210, so that the fan modules 500 are fixed to the base 200.

In this embodiment, the server 10 further includes a cable assembly 700. The third connector 550 of the fan module 500 and the back plate 300 are connected to each other via the cable assembly 700. The cable assembly 700 includes two cable connectors 710 and 720, and a cable part 730 connected to the cable connectors 710 and 720. The cable connectors 710 and 720 are electrically connected to the first connector 311 and the third connector 550, so that the fan module 500 is electrically connected to the back plate 300.

In this embodiment, the mounting holes 511 and the blocks 220 are able to be connected without using screws, which is favorable for efficiently assembling the fan modules 500 to the base 200.

In this embodiment, the server 10 further includes a holder 800. The holder 800 is fixed to the base 200 and located in the fan accommodating space S1. The holder 800 and the back plate 300 are separated apart from each other. The holder 800 and the back plate 300 jointly form a space S3 therebetween, for cable management. The cable connectors 710 are mounted on the holder 800, and at least a part of the cable part 730 is located in the space S3, for the cable part 730 to be tidily placed in the space S3.

In this embodiment, the fan module 500 further includes two guiding protrusions 560. The guiding protrusions 560 are mounted on the frame 510. The holder 800 has four guiding holes 810. When the fan module 500 is mounted on the base 200, the guiding protrusions 560 respectively penetrate through the guiding holes 810, so that the third connector 550 is precisely connected to the cable connector 710 on the holder 800. However, the present disclosure is not limited to the amounts of the guiding protrusions 560 and guiding holes 810. In other embodiments, the fan module may include only one guiding protrusion, and the holder may only have one guiding hole.

In this embodiment, the fan module 500 further includes a casing 570. The casing 570 is fixed to the frame 510. The casing 570 has an accommodating space S4. The third connector 550, the cable assembly 700 and the holder 800 are located in the accommodating space S4.

According to the server as discussed above, the back plate is mounted on the base, and the back plate and the base jointly form the hard disk accommodating space and the fan accommodating space. Therefore, the fan and the hard disk share the same back plate; that is, the back plate is configured as a fan back plate and a hard disk back plate, simultaneously. Therefore, it is favorable for increasing the amounts of the hard disk and the fan in a limited space.

In addition, the fan modules are connected to the back plate via cable assembly, which is favorable for efficiently assembling the fan modules to the back plate.

Furthermore, the holder fixed to the base is separated apart from the back plate, so there is a space formed between the holder and the back plate for cable management. Therefore, the cable assembly is able to be placed in the space, which is favorable for improving the space utilization.

What is claimed is:

1. A server, comprising:
   a motherboard;
   a base, being fixed on the motherboard;
   a back plate, being placed upright on the base, the back plate and the base jointly forming a fan accommodating space and a hard disk accommodating space, the back plate having a first side face and a second side face, the first side face facing the fan accommodating space, the second side face facing the hard disk accommodating space, and the back plate being electrically connected to the motherboard wherein the first side face of the back plate has a first connector;
   a hard disk being located in the hard disk accommodating space and electrically connected to the back plate;
   a fan module being located in the fan accommodating space and electrically connected to the back plate, and the fan module being electrically connected to the motherboard via the back plate; wherein the fan module comprises a casing and a frame, the casing fixed to the frame, the fan module has a second connector electrically connectable to the first connector, and the casing has an accommodating space;
   a cable assembly, the cable assembly comprising two cable connectors and a cable part connected to the two cable connectors, and the two cable connectors respectively electrically connectable to the first connector and the second connector; and
   a holder fixed to the base and located in the fan accommodating space, the holder and the back plate being separated from each other, the holder and the back plate jointly form a space therebetween for cable management, one of the two cable connectors being mounted on the holder, and at least a part of the cable part being located in the space between the holder and the back plate; wherein the second connector, the cable assembly and the holder are located in the accommodating space of the casing.

2. The server according to claim 1, wherein the fan module further comprises the frame, a fan and a plurality of fasteners, and the fan is fastened to the frame via the plurality of fasteners.

3. The server according to claim 1, wherein the base is fixed to the motherboard via a fastener.

4. The server according to claim 1, wherein the fan module further comprises a fixed elastic plate fixed to the frame, the fixed elastic plate has at least one fastening structure, the base has at least one fastening hole located in the fan accommodating space, and the at least one fastening structure is detachably hooked to the at least one fastening hole.

5. The server according to claim 1, wherein the frame further comprises at least one mounting hole, the at least one mounting hole has an enlarged portion and a reduced portion, the base has a block located in the fan accommodating space, the enlarged portion of the at least one mounting hole has a first width, the reduced portion of the at least one mounting hole has a second width, the block has a third width, the first width is greater than the third width, and the second width is less than the third width.

6. The server according to claim 1, wherein the second side face of the back plate has a third connector, and the hard disk has a fourth connector electronically connectable to the third connector.

7. The server according to claim 1, wherein the fan module further comprises at least one guiding protrusion mounted on the frame, the holder has at least one guiding hole, and the at least one guiding protrusion penetrates through the at least one guiding hole.

* * * * *